United States Patent [19]
Dingwall

[11] Patent Number: 4,733,217
[45] Date of Patent: Mar. 22, 1988

[54] SUBRANGING ANALOG TO DIGITAL CONVERTER

[75] Inventor: Andrew G. F. Dingwall, Princeton, N.J.

[73] Assignee: RCA Corporation, Princeton, N.J.

[21] Appl. No.: 860,806

[22] Filed: May 8, 1986

[51] Int. Cl.$^4$ .............................................. H03M 1/42
[52] U.S. Cl. ........................... 340/347 AD; 324/99 D; 340/347 M; 340/347 SH
[58] Field of Search ................. 340/347 AD, 347 SH, 340/347 M; 324/99 D

[56] References Cited

U.S. PATENT DOCUMENTS

| | | | |
|---|---|---|---|
| 3,597,761 | 8/1971 | Fraschilla et al. | 340/347 AD |
| 3,820,112 | 6/1974 | Roth | 340/347 AD |
| 4,345,241 | 8/1982 | Takeuchi et al. | 340/347 CC |
| 4,398,179 | 8/1983 | Kaneko | 340/347 AD |
| 4,456,904 | 6/1984 | van de Grift | 340/347 AD |
| 4,542,370 | 9/1985 | Yamada et al. | 340/347 AD |
| 4,571,574 | 2/1986 | Krynicki | 340/347 AD |
| 4,612,531 | 9/1986 | Dingwall et al. | 340/347 AD |

OTHER PUBLICATIONS

A. G. F. Dingwall et al; "An 8-MHz CMOS Subranging 8-bit A/D Converter", Dec. 1985; IEEE Jour. of Solid State Circuits, vol. SC-20, No. 6, pp. 1138-1143.

*Primary Examiner*—T. J. Sloyan
*Attorney, Agent, or Firm*—Paul J. Rasmussen; Eric P. Herrmann; David N. Caracappa

[57] ABSTRACT

A subranging analog-to-digital converter is disclosed. A coarse analog-to-digital converter has an analog input terminal coupled to a source of analog signal, a digital output terminal, and a range indication output terminal. First and second fine analog-to-digital converters each have an analog input terminal coupled to the analog signal source, a range selection input terminal coupled to the range indication output terminal, and a digital output terminal. A combining circuit has input terminals coupled to the digital output terminals of the coarse and first and second fine analog-to-digital converters. The coarse analog-to-digital converter operates on every clock cycle, and the fine analog-to-digital converters operate alternately on every other clock cycle to produce a sequence of digital samples representing the analog signal, one for each clock cycle.

4 Claims, 5 Drawing Figures

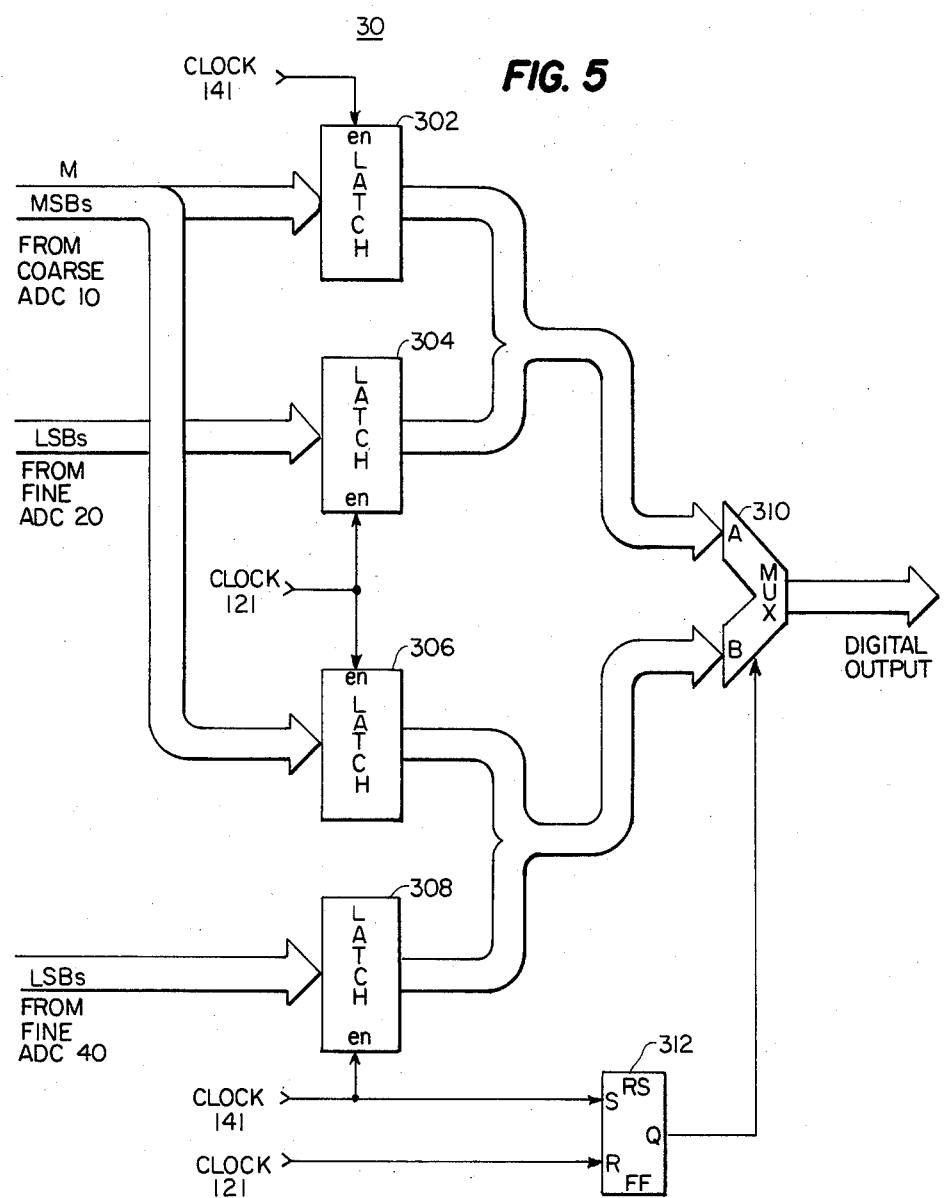

SUBRANGING ANALOG TO DIGITAL CONVERTER

The present invention relates to a subranging analog-to-digital converter (ADC) including a coarse ADC coupled in series with two fine ADCs coupled in parallel.

High speed ADCs are critical building blocks for video and other digital signal processing applications. Standard digital video processing may require conversion of an input analog video signal to a sequence of digital samples at four times the color subcarrier rate, which in the NTSC video system is approximately 14 MHz.

A paper entitled "An 8 MHz CMOS Subranging 8-bit A/D Converter" by A.G.F. Dingwall and V. Zazzu in the IEEE Journal of Solid State Circuits, Vol. SC-20, No. 6, December 1985 (incorporated herein by reference) describes a subranging type ADC which requires two successive operating phases to produce a digital sample representing the sampled analog input signal. In the first operating phase, the analog input signal is compared to 16 reference values in a set of 15 comparators. The coarse comparison establishes which one of 16 ranges of analog values the analog input signal is within, and generates the four more significant bits (MSBs) of the digital output signal.

The same analog signal is then compared in a second set of 15 comparators with a second series of 16 reference values which are selected in response to the coarse comparison. The second, fine, comparison, establishes which one of 16 subranges of analog values (in the range determined by the coarse comparison) the analog input signal is within, and generates the four lesser significant bits (LSBs) of the digital output signal. The results of the first and second comparisions are combined to form an 8-bit sample representing the level of the analog input signal.

The coarse and fine comparisons, require two successive clock cycles to complete. During the first clock cycle, the coarse comparison is performed. During the second clock cycle, the fine comparison is performed based on the results of the coarse comparison. Thus, each 8-bit sample requires two clock cycles to be generated. Present low cost ADC technology allows processing at a 16 MHz clock frequency. The ADC described above, thus, produces digital samples at an 8 MHz rate. It is desirable to produce one sample for each clock cycle and, thus, to achieve a 16 MHz rate which is sufficient for digital video signal processing applications.

Apparatus in accordance with the principles of the present invention includes a coarse ADC having an input port coupled to an analog input terminal, a digital output terminal and a range indication output terminal. First and second fine ADCs each have an input port coupled to the analog input terminal, a range selection input terminal coupled to the range indication output terminal of the coarse ADC and a digital output terminal. Circuitry coupled to the coarse and fine ADCs sequences the operation of the coarse ADC to operate on every clock cycle and the operation of the fine ADCs to operate alternately every other clock cycle. The digital results from the coarse and two fine ADCs are combined to produce a sequence of digital samples representing the signal at the analog input terminal.

In the drawings:

FIG. 5 is a block diagram of a combining circuit which may be used in the ADC illustrated in FIG. 1.

Figure 1:
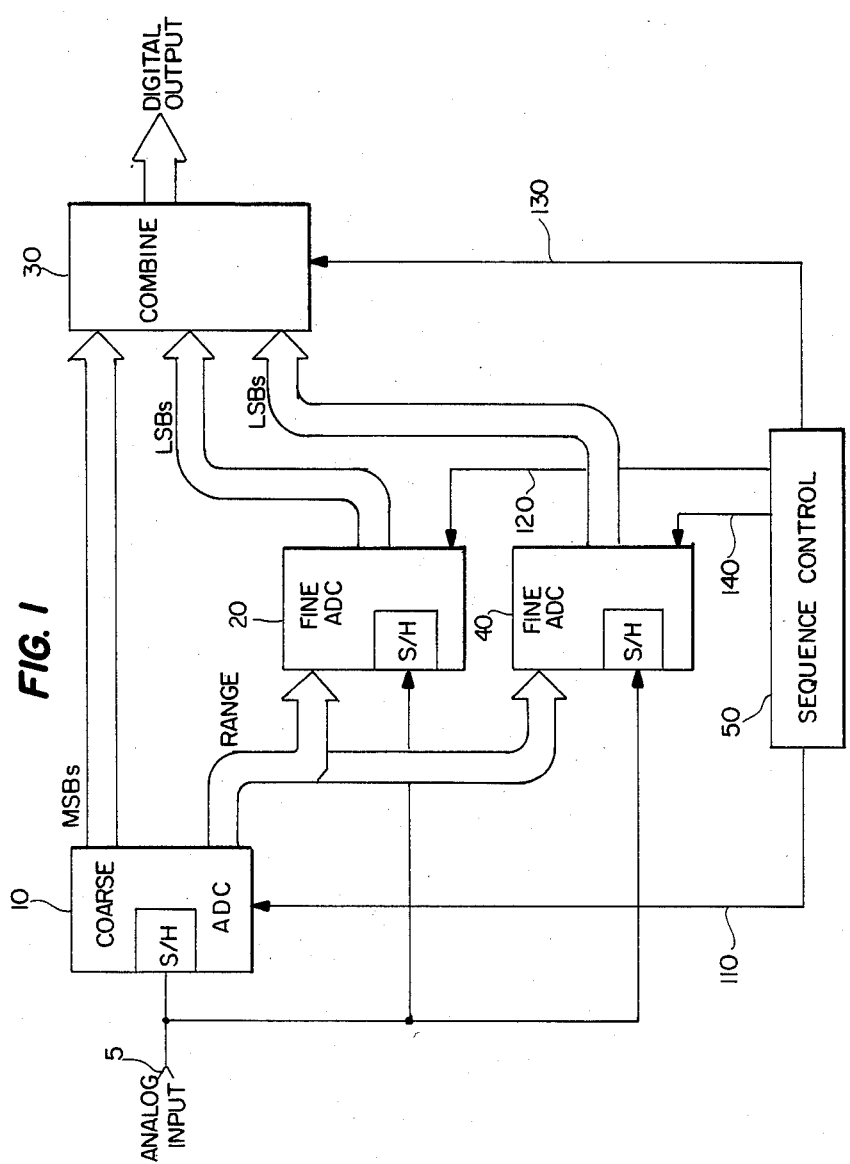
FIG. 1 is a block diagram of a subranging ADC in accordance with the principles of the present invention.

In FIG. 1, thin lines represent analog signal or clock signal carrying connections and thick lines represent digital signal carrying connections which may include multibit parallel connections.

An analog input signal from a source of analog signal (not shown) is applied to analog input terminal 5. Analog input terminal 5 is coupled to analog input terminals of a coarse ADC 10 and fine ADCs 20 and 40 respectively. Coarse ADC 10 produces at a digital output the MSBs representing a coarse digital approximation of the level of the analog input signal. The MSBs are coupled to one input of combining circuitry 30. Coarse ADC 10 also produces a range indication signal. The range indication signal is coupled to range selection input terminals of fine ADCs 20 and 40 respectively. The range indication signal may be a digital signal to indicate which range of analog values contains the value of the analog input signal. This digital indication may be the MSBs themselves. Alternatively, the range indication signal may be analog signals which define the upper and lower boundary values of the range of analog values containing the value of the analog input signal, as illustrated in U.S. Pat. No. 4,542,370 entitled "Cascade-Comparator A/D Converter" issued Sep. 17, 1985 to Yamada et al. The range indication signal may also be a combination of analog and digital signals as described in the above-mentioned article by Dingwall and Zazzu.

Fine ADCs 20 and 40 produce at respective digital output terminals the LSBs of the digital signal representing the input analog signal. These LSB outputs are coupled to further inputs of the combining circuitry 30. Combining circuitry 30 combines the MSBs from the coarse ADC 30 with the corresponding LSBs from the appropriate fine ADC 20 or 40, and arranges them into a sequence of digital output samples representing the input analog signal.

Sequence control circuitry 50 generates clock signals 110, 120, 140 and 130 which are coupled to coarse ADC 10, fine ADCs 20 and 40 and combining circuitry 30 respectively. These clock signals control and sequence the operation of these components, as described in more detail below. Sequence control circuitry 50 may, for example, include a master oscillator (which may be locked to a color burst or horizontal synchronization component of a composite video signal), and various frequency dividers and associated logic circuitry.

Figure 2:
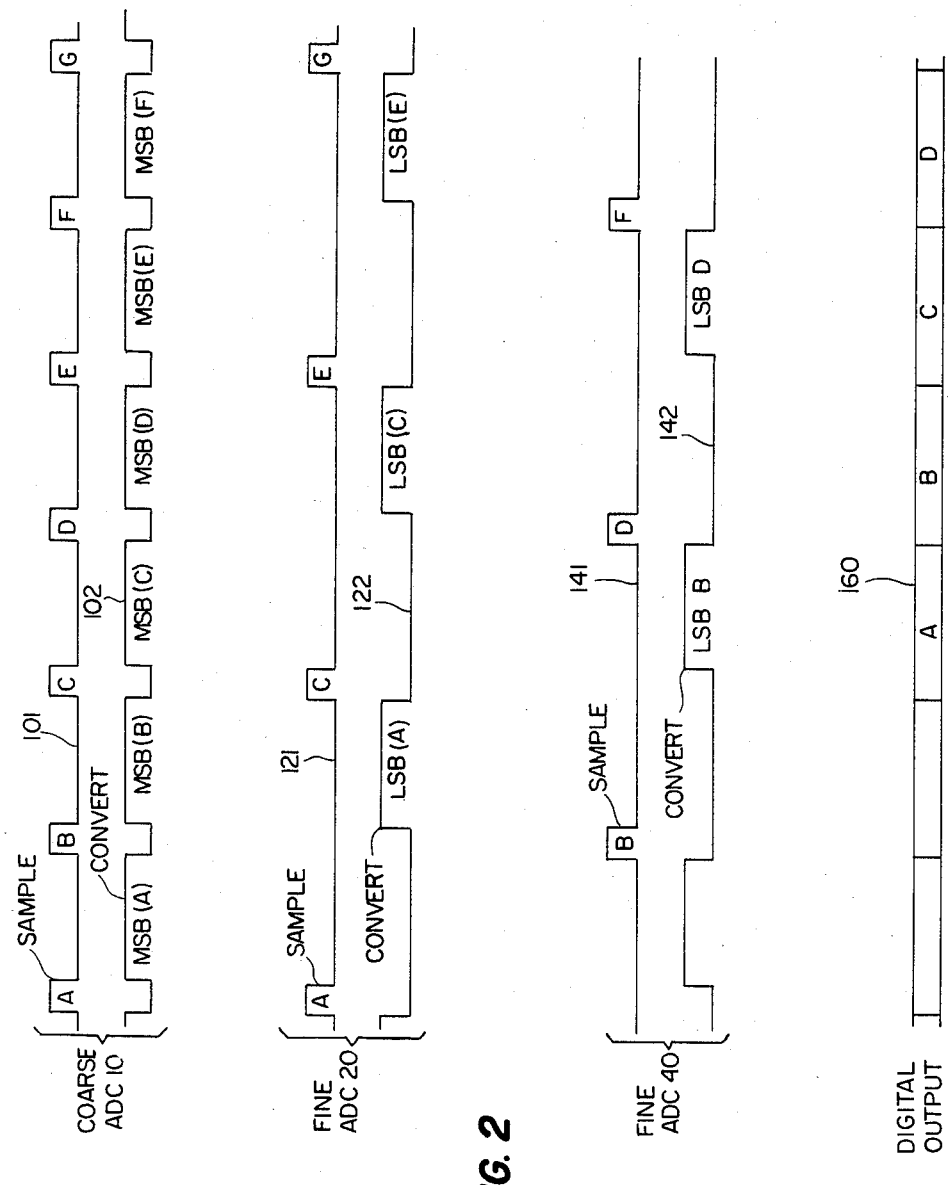
FIG. 2 is a timing diagram useful in understanding the operation of the ADC illustrated in FIG. 1.

The operation of the ADC illustrated in FIG. 1 may be better understood by reference to the timing diagrams illustrated in FIG. 2. Each of the exemplary ADCs 10, 20 and 40 illustrated in FIG. 1 include a sample and hold (S/H) circuit which has an input coupled to the analog input terminal 5. Waveform 101 of FIG. 2 illustrates a sample clock supplied to the S/H circuit of coarse ADC 10. Waveform 102 illustrates the timing of the production of the MSBs of successive samples by coarse ADC 10. The leftmost pulse of sample clock 101 conditions that S/H circuit to sample the analog input signal at time A. The next leftmost pulse conditions it to sample at time B and so forth. The leftmost pulse of waveform 102 illustrates the time period when ADC 10 is providing the MSBs of sample A (MSB(A)) and so forth.

Waveform 121 illustrates a sample clock supplied to the S/H circuit of fine ADC 20. The leftmost pulse conditions the S/H circuit in ADC 20 to sample the analog input signal at time A. The next leftmost pulse conditions it to sample at time C and so forth. Waveform 122 illustrates the time periods when fine ADC 20 provides the LSBs of the analog input signal. Fine ADC 20 cannot begin the conversion of sample A to generate its LSBs (LSB(A)) until coarse ADC 10 provides the range information for the current sample A. The fine conversion period for analog sample A, thus, is delayed until after the coarse conversion of sample A is completed. The fine conversion is arbitrarily selected to begin at time B. At the end of the leftmost conversion period shown in waveform 122, the complete digital sample representing the analog input signal at time A is assembled in combining circuitry 30 and is made available, as illustrated in digital output sequence 160, as digital sample A. Fine ADC 20 does not begin another conversion until time C. The combination of coarse ADC 10 and fine ADC 20, thus, generates a complete digital sample every two clock cycles.

By adding fine ADC 40, a complete digital sample may be obtained every clock cycle in the following manner. At time B, the S/H circuits of coarse ADC 10 and fine ADC 40 both sample the analog input signal, as illustrated in waveforms 101 and 141. As illustrated in waveform 102, coarse ADC 10 generates the MSBs of sample B. When coarse ADC 10 has completed its conversion, nominally at time C, fine ADC 40 begins conversion of analog sample B to generate its LSBs (LSB(B)) as illustrated in waveform 142. At time D, the complete digital sample representing the analog input signal at time B is assembled in combining circuitry 30 and is made available, as illustrated in digital output sequence 160, as digital sample B.

Coarse ADC 10 produces the MSBs of the analog samples at each clock cycle and fine ADCs 20 and 40 produce the LSBs of analog samples at alternate clock cycles. Thus the ADC illustrated in FIG. 1 produces a complete digital sample at every clock cycle.

Figure 3:
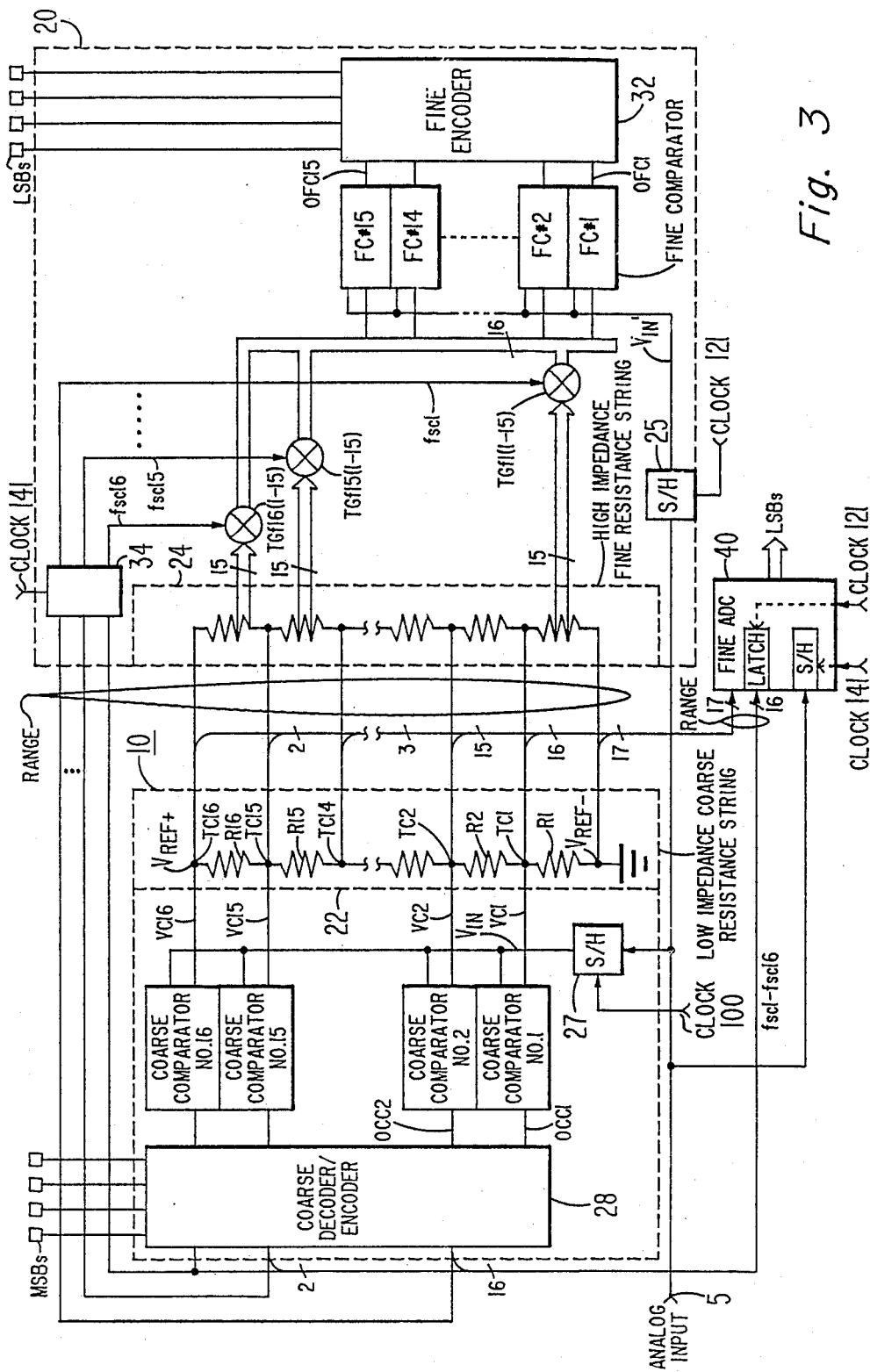
FIG. 3 is a partial schematic, partial block, diagram of an ADC embodying the invention.

FIG. 3 illustrates a more detailed configuration of an 8-bit A/D converter embodying the invention. Coarse ADC 10 includes a coarse resistor element 22 with $2^4$ coarse taps (TCi) located at equal increments along the string, $2^4$ coarse comparators, a coarse S/H circuit 27, and a coarse logic array decoder/encoder 28. Fine ADC 20 includes a fine resistor string 24 comprised of $2^4$ segments with each segment further subdivided into $2^4$ sub-segments with $(2^4-1)$ fine taps formed between each of the $2^4$ fine sub-segments. The fine segment also includes $(2^4-1)$ transmission gates per segment for coupling the $(2^4-1)$ taps of a sub-segment to the corresponding $(2^4-1)$ fine comparators. Fine ADC 20 further includes a fine S/H circuit 25, and a fine logic array encoder 32. A similar fine ADC 40 is coupled in parallel with fine ADC 20.

The coarse resistor element 22 is a string of resistive elements of equal value, serially coupled between $V_{REF}+$ and $V_{REF}-$ with taps formed at the junctions between the resistors. A further tap (e.g. TC16) may be connected to the end of the resistor (e.g. R16) connected to $V_{REF}+$. The coarse resistor element 22 produces substantially equal voltage increments across the resistive elements located between each tap. Consequently, the voltage increases monotonically along the coarse resistor from the tap closest to $V_{REF}-$ to the tap closest to $V_{REF}+$.

The coarse resistor network 22 is a relatively low impedance resistance. By way of example, in the embodiment of FIG. 3, the total impedance of network 22 between $V_{REF}+$ and $V_{REF}-$ is approximately 500 ohms. Network 22 is divided into 16 (i.e. $2^4$) coarse segments of substantially equal ohmic increments (e.g. approximately 30 ohms each) to produce 16 substantially equal reference voltage steps, which can be represented by 4 bits. In the discussion to follow, it is assumed, for illustration, that $V_{REF}-$ is ground and $V_{REF}+$ is 6.4 volts. The voltage drop ($\Delta VC$) across each coarse segment is 400 millivolts, with the voltage at a succeeding tap along the string being 400 millivolts greater than the voltage at a preceding tap.

There are 16 coarse comparators, one comparator for each coarse tap along resistor network 22 including a sixteenth comparator for the tap to which $V_{REF}+$ is applied. The sixteenth comparator senses an overflow condition, i.e. when $V_{IN}$ (the voltage of the signal at the output of S/H circuit 27) is greater than $V_{REF}+$. In applications where it is not necessary to sense the overflow condition, the sixteenth comparator may be eliminated.

The outputs (OCCi) of the coarse comparators are applied to the coarse logic array decoder/encoder 28 which produces (1) a coarse indication of the value of $V_{IN}$; and (2) control signals indicative of the two taps exhibiting the incremental reference value which bracket the input voltage being sampled. Logic array decoder/encoder 28 may be of the type used in the CA3300 and CA3308 integrated circuits manufactured by RCA Corp. and described in data sheet published by RCA Corp. Alternatively, the decoder/encoder 28 may be any one of a number of known decoder/encoder arrangements capable of producing functions 1 and 2 noted above.

Figure 4:
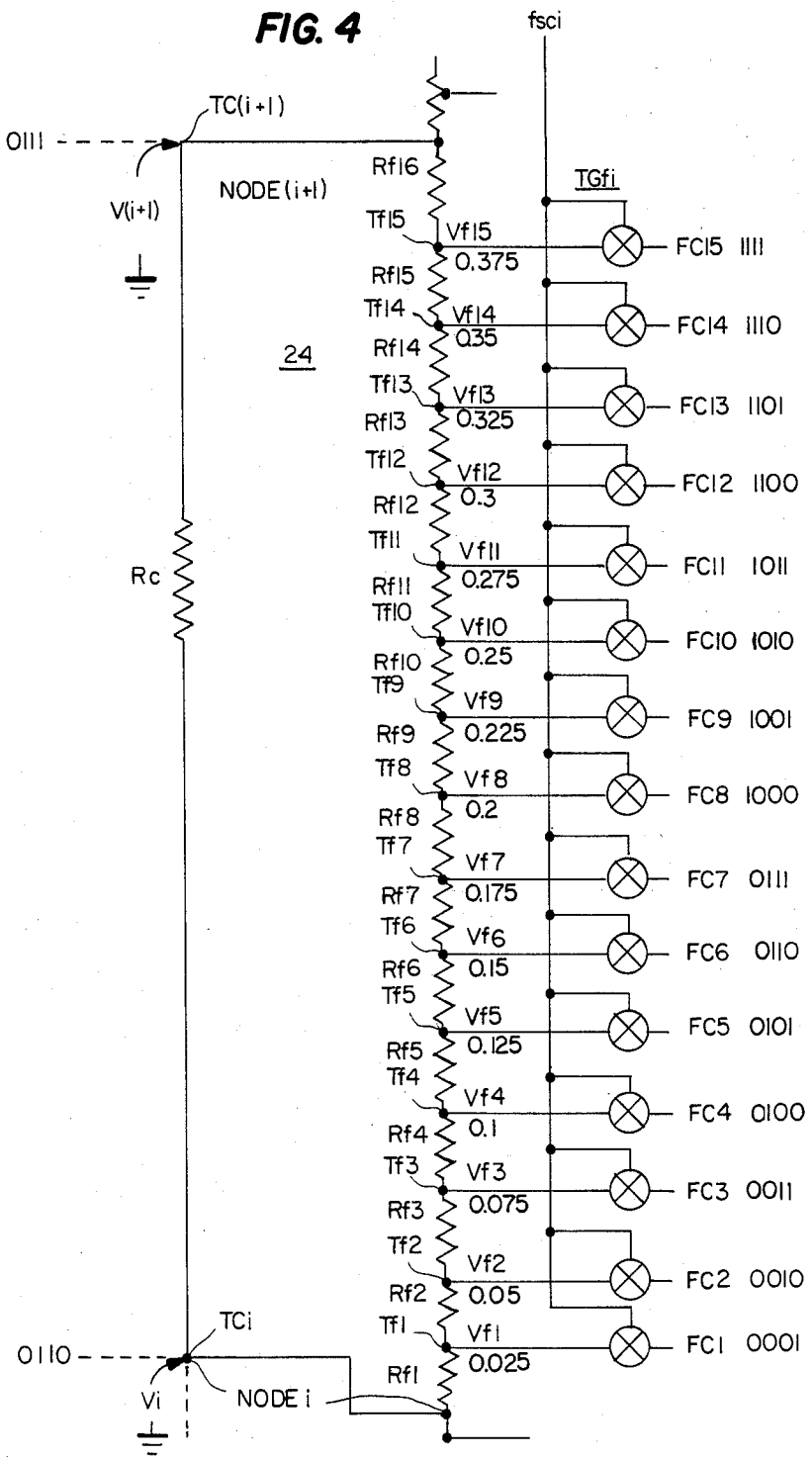
FIG. 4 is a detailed schematic diagram of a coarse resistor segment connected in parallel with a fine resistive element.

In fine ADC 20, resistor network 24 is divided into 16 (e.g. $2^4$) fine resistive elements (or fine segments) with each fine resistive element being connected in parallel with a corresponding coarse segment, as shown in FIG. 4. Each fine resistive element is subdivided into $2^4$ (or 16) sub-segments to provide $2^4$ (or 16) fine reference voltage steps between each pair of coarse taps [TCi and TCi+1].

As illustrated in FIG. 4, a fine tap (Tfi) is connected, or formed, at the junctions of every two fine sub-segments of each resistive element resulting in 15 fine taps (Tf1 through Tf15) at which are produced 15 different fine monotonically increasing reference voltage levels ($V_{f1}$ through $V_{f15}$).

The total ohmic value of the fine resistive element between a pair of coarse taps is typically 100 times the ohmic value of the coarse resistor (Rc) connected between those two taps. By way of example, where the coarse resistor value is approximately 30 ohms, the ohmic value of the fine resistive element is 3200 ohms and the impedance between any two fine taps is approximately 200 ohms. Hence the voltage level at each coarse tap is primarily determined by the coarse resistance.

Referring again to FIG. 3, there are 16 sets of fine transmission gates, (TGfi) each set being comprised of 15 transmission gates (as shown in FIG. 4). Each set of fine transmission gates is enabled by a control signal (fsci) produced by coarse logic array 28. During operation of the A/D converter, only one set of fine transmission gates is enabled at any one time. When the set of fine transmission gates is enabled, the 15 fine taps associated with that set are coupled to their corresponding fine comparator inputs.

FIGS. 3 and 4 are intended to show that whenever a coarse segment brackets an input voltage, the 15 fine taps (Tfi) contained within the bracketing coarse segment are coupled in accordance with their ordered arrangement via 15 transmission gates TGfj (1–15) to the reference input of like ordered comparators.

There are 15 fine comparators (FC1 through FC15) illustrated in FIG. 3 whose outputs are coupled to fine decoder/encoder circuit 32. Each fine comparator has two inputs. One input is responsive to the voltage ($V_{IN}'$) at the output of S/H circuit 25 of fine ADC 20. The other input is responsive to one of the 15 selected fine reference voltage input coupled thereto by the respective transmission gate.

The outputs (OFCi) of the fine comparators FCi are applied to a fine logic array decoder/encoder circuit 32 of FIG. 3. Circuit 32 produces an output which indicates the value of an input voltage being sampled within its four least significant bits (LSB). Fine ADC 40 is constructed similarly to fine ADC 20 and will not be described in detail.

FIG. 5 illustrates a combining circuit 30 which may be used in the ADC of FIG. 1. The MSBs from coarse ADC 10 are coupled to the data input terminals of four bit latches 302 and 306. The LSBs from fine ADCs 20 and 40 are coupled to the data input terminals of four bit latches 304 and 308 respectively. The four bit output terminals from latches 302 and 304 are concatenated to form an eight bit signal which is routed to one data input terminal A of a multiplexer (MUX) 310. The four bit output terminals from latches 306 and 308 are also concatenated to form an eight bit signal which is routed to another data input terminal B of the MUX 310. The data output terminal of MUX 310 is coupled to the digital output terminal of the ADC.

A clock signal, as illustrated in waveform 141 of FIG. 2, is coupled to latch enable input terminals (en) of latches 302 and 308 and the set (S) input terminal of RS flip-flop (FF) 312. A clock signal, as illustrated in waveform 121 of FIG. 2, is coupled to latch enable input terminals (en) of latches 304 and 306 and the reset (R) input terminal of RS FF 312. The output terminal Q of RS FF 312 is coupled to the control input terminal of MUX 310.

The operation of combining circuit 30 is most easily understood by reference to the waveforms illustrated in FIG. 2. When the MSBs of analog sample A have been converted (at time B), they are latched in latch 302 through the application of waveform 141 to its latch enable input. When the LSBs of analog sample A have been converted (at time C), they are latched in latch 304 through application of waveform 121 to its latch enable input. Also at time C, waveform 121 conditions RS FF 312 to produce a logic '0' signal at its output terminal. This logic '0' signal, which is applied at the control input terminal of MUX 310, conditions MUX 310 to couple the signal at data input terminal A to the data output terminal. Digital sample A is thus produced at the digital output terminal at time C, as illustrated in digital signal sequence 160 of FIG. 2.

When the MSBs of analog sample B have been converted (at time C), they are latched in latch 306 through the application of waveform 121 to its latch enable input. When the LSBs of analog sample B have been converted (at time D), they are latched in latch 308 through application of waveform 141 to its latch enable input. Waveform 141 also conditions RS FF 312 to produce a logic '1' signal at its output terminal. This logic '1' signal, which is applied at the control input terminal of MUX 310, conditions MUX 310 to couple the signal at data input terminal B to the data output terminal. Digital sample B is thus produced at the digital output terminal at time D, as illustrated in digital signal sequence 160 of FIG. 2. As the above sequence repeats, digital signal sequence 160 is produced at the digital output terminal at a rate of one sample per clock cycle.

Although any subranging coarse and fine ADC converters may be used as the ADCs 10, 20 and 40, subranging ADCs of the flash conversion type will give best performance.

What is claimed is:

1. A subranging analog-to-digital converter, comprising:
   an analog input terminal;
   a coarse analog-to-digital converter having an analog input port coupled to said input terminal, a digital output terminal and a range indication output terminal;
   first and second fine analog-to-digital converters each having an analog input port coupled to said input terminal, a range selection input terminal coupled to said range indication output terminal, and a digital output terminal; and
   means having respective input terminals coupled to the digital output terminals of said coarse and said first and second fine analog-to-digital converters for alternately combining signals from said first and second fine analog-to-digital converters with signals from said coarse analog-to-digital converter to produce a sequence of digital samples representing said analog signal.

2. The converter of claim 1 wherein said coarse and said first and second fine analog-to-digital converters each comprise a sample and hold circuit responsive to said analog input signal.

3. The converter of claim 2 wherein said sample and hold circuits of said coarse and said first fine analog-to-digital converters are conditioned to sample simultaneously at successive points in time, and said sample and hold circuits of said coarse and said second fine analog-to-digital converters are conditioned to sample simultaneously at points of time intermediate to said successive points in time.

4. The converter of claim 1, wherein:
   said subranging analog-to-digital converter produces said sequence of digital samples each having n bits, where n is an integer greater than 2;
   said coarse analog-to-digital converter includes a coarse resistor element having $2^x$ coarse segments having substantially equal ohmic increments, where x is an integer less than n; and
   said first and second fine analog-to-digital converters each respectively include a fine resistor string having $2^x$ fine segments connected in parallel with a corresponding coarse segment, and each fine segment being subdivided into $2^{(n-x)}$ fine subsegments.

* * * * *